(12) United States Patent
Han et al.

(10) Patent No.: US 12,517,401 B2
(45) Date of Patent: Jan. 6, 2026

(54) DISPLAY APPARATUS

(71) Applicant: SAMSUNG ELECTRONICS CO., LTD., Suwon-si (KR)

(72) Inventors: Hyesung Han, Suwon-si (KR); Bupmyoung Kim, Suwon-si (KR); Sungho Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 223 days.

(21) Appl. No.: 18/218,913

(22) Filed: Jul. 6, 2023

(65) Prior Publication Data
US 2024/0103325 A1    Mar. 28, 2024

Related U.S. Application Data

(63) Continuation of application No. PCT/KR2023/008465, filed on Jun. 19, 2023.

(30) Foreign Application Priority Data

Sep. 26, 2022    (KR) .................. 10-2022-0121982

(51) Int. Cl.
*G02F 1/1345*    (2006.01)

(52) U.S. Cl.
CPC ...... *G02F 1/13452* (2013.01); *G02F 2201/56* (2013.01)

(58) Field of Classification Search
CPC .. G02F 1/1332; G02F 1/1333; G02F 1/13314; G02F 1/13354; G02F 1/1336;
(Continued)

(56) References Cited

U.S. PATENT DOCUMENTS 9,560,761 B2    1/2017    Kishida et al.
9,733,502 B2    8/2017    Lee et al.
(Continued)

FOREIGN PATENT DOCUMENTS

CN    105741678 A    7/2016
CN    107463033 A    12/2017
(Continued)

OTHER PUBLICATIONS

International Search Report dated Oct. 12, 2023, issued by the International Searching Authority in International Application No. PCT/KR2023/008465 (PCT/ISA/210).
(Continued)

*Primary Examiner* — Tuan T Dinh
(74) *Attorney, Agent, or Firm* — Sughrue Mion, PLLC (57) ABSTRACT

A display apparatus includes a display panel having a curvature, a plurality of chip-on-films connected to a side of the display panel, a first printed circuit board (PCB) connected to a first part of the plurality of chip-on-films, and a second PCB provided farther outside of the display panel than the first PCB from a center of the display panel, the second PCB being connected to a second part of the plurality of chip-on-films, and a number of chip-on-films of the second part of the plurality of chip-on-films is different than a number of chip-on-films of the first part of the plurality of chip-on-films.

18 Claims, 7 Drawing Sheets

(58) Field of Classification Search
CPC .. G02F 1/133606; H05K 1/142; H05K 1/147; H05K 1/181; H05K 1/187; G09G 3/3266; G09G 3/3275; G09G 3/3225
USPC ................ 361/749–750, 782–784, 795, 803; 349/149–150
See application file for complete search history.

(56) References Cited

U.S. PATENT DOCUMENTS

| | | | |
|---|---|---|---|
| 10,108,032 B2 | 10/2018 | Moon et al. | |
| 10,111,352 B2 | 10/2018 | Ahn et al. | |
| 10,986,726 B2 | 4/2021 | Lim et al. | |
| 2011/0292313 A1* | 12/2011 | Takenaka | H05K 1/189 349/42 |
| 2013/0321740 A1 | 12/2013 | An et al. | |
| 2014/0139413 A1* | 5/2014 | Kwon | H10K 59/88 345/82 |
| 2016/0165726 A1* | 6/2016 | Lee | H05K 1/147 361/783 |
| 2016/0190228 A1* | 6/2016 | Park | H10K 59/1315 257/40 |
| 2016/0196795 A1* | 7/2016 | Kim | G09G 3/3696 345/211 |
| 2017/0287380 A1 | 10/2017 | Zhao | |
| 2020/0320951 A1* | 10/2020 | Shin | G02F 1/13452 |
| 2021/0056908 A1* | 2/2021 | Park | G09G 3/3275 |
| 2022/0171231 A1 | 6/2022 | Shibahara | |
| 2022/0261049 A1* | 8/2022 | Yun | H05K 1/117 |

FOREIGN PATENT DOCUMENTS

| | | |
|---|---|---|
| CN | 110767089 A | 2/2020 |
| CN | 212410981 U | 1/2021 |
| CN | 113724592 A | 11/2021 |
| CN | 217880691 U | 11/2022 |
| JP | 2009-20228 A | 1/2009 |
| KR | 10-2008-0011870 A | 2/2008 |
| KR | 10-2015-0079235 A | 7/2015 |
| KR | 10-2016-0070893 A | 6/2016 |
| KR | 10-2016-0104197 A | 9/2016 |
| KR | 10-2016-0129494 A | 11/2016 |
| KR | 10-1830247 B1 | 2/2018 |
| KR | 10-2374299 B1 | 3/2022 |
| KR | 10-2394393 B1 | 5/2022 |
| KR | 10-2414074 B1 | 6/2022 |

OTHER PUBLICATIONS

Written Opinion dated Oct. 12, 2023, issued by the International Searching Authority in International Application No. PCT/KR2023/008465 (PCT/ISA/237).

Communication issued on Aug. 11, 2025 by the European Patent Office in European Patent Application No. 23872701.0.

* cited by examiner

DISPLAY APPARATUS

CROSS-REFERENCE TO RELATED APPLICATIONS

This application is a bypass continuation of PCT International Application No. PCT/KR2023/008465 filed on Jun. 19, 2023, which claims priority to Korean Patent Application No. 10-2022-0121982, filed on Sep. 26, 2022 in the Korean Intellectual Property Office, the disclosures of which are incorporated herein by reference.

BACKGROUND

1. Field

The disclosure relates to a display apparatus having an enhanced structure for the layout of chip-on-films and printed circuit boards.

2. Description of Related Art

Display apparatuses may be output devices that convert electrical information to visual information and display the visual information for the user.

The display apparatus may include a display module for displaying an image and a supporting device for supporting the display module. The supporting device may be provided to support the display module so that the front face of the display module may be opposite the viewer.

The display apparatus may include chip-on-films and printed circuit boards (PCBs). The chip-on-film may include a semiconductor chip which is a display driver chip. The chip-on-film may be located between and electrically connected to the at least one PCB and a display panel.

As for a curved display apparatus, however, a curvature of the display module may cause concentrated stress to be applied on the at least one chip-on-film and the connected at least one PCB.

SUMMARY

Provided is a display apparatus having an enhanced structure to reduce stress applied on chip-on-films and printed circuit boards when the display apparatus is a curved display apparatus.

According to an aspect of the disclosures, a display apparatus includes: a display panel; a plurality of chip-on-films connected to a side of the display panel; a first printed circuit board (PCB) connected to a first part of the plurality of chip-on-films; and a second PCB provided farther outside of the display panel than the first PCB from a center of the display panel, the second PCB being connected to a second part of the plurality of chip-on-films, and a number of chip-on-films of the second part of the plurality of chip-on-films is different than a number of chip-on-films of the first part of the plurality of chip-on-films.

The number of chip-on-films of the first part of the plurality of chip-on-films connected to the first PCB may be two, and the number of chip-on-films of the second part of the plurality of chip-on-films connected to the second PCB may be four.

The display panel may include a first area having a first curvature; a second area having a second curvature and extending outward from the first area; and a third area having no curvature and extending outward from the second area.

The first part of the plurality of chip-on-films may include: a first chip-on-film; and a second chip-on-film spaced apart from the first chip-on-film, wherein the second part of the plurality of chip-on-films may include: a third chip-on-film spaced apart from the second chip-on-film; a fourth chip-on-film spaced apart from the third chip-on-film; a fifth chip-on-film spaced apart from the fourth chip-on-film, and a sixth chip-on-film spaced apart from the fifth chip-on-film.

The first chip-on-film may be in the first area, the second chip-on film and the third chip-on-film may be in the second area, and the fourth chip-on film, the fifth chip-on film, and the sixth chip-on film may be in the third area.

The first PCB may be separate from the second PCB between the second chip-on-film and the third chip-on-film.

The first curvature may be higher than the second curvature.

The plurality of chip-on-films may be equidistantly arranged.

The display apparatus may include another plurality of chip-on-films connected to the display panel on other side of the center of the display panel arranged symmetrically to the plurality of chip-on-films.

The display apparatus may include a light source module behind the display panel and configured to generate light; and an optical sheet between the light source module and the display panel.

The display apparatus may include a bottom chassis having a curvature provided behind the display panel; and a top chassis having a curvature provided in front of the display panel.

According to an aspect of the disclosure, a display apparatus includes: a display panel having a curvature; a plurality of chip-on-films connected to the display panel; and a plurality of printed circuit boards (PCBs) connected to the plurality of chip-on-films and separately arranged to have bilateral symmetry based on a center of the display panel, wherein a number of chip-on-films connected to a pair of first PCBs is different than a number of chip-on films connected to a pair of second PCBs.

The plurality of PCBs may include: the pair of first PCBs may be connected to a part of the plurality of chip-on-films and are symmetrically arranged based on a center of the display panel; and the pair of second PCBs are connected to another part of the plurality of chip-on-films and are symmetrically arranged based on the center of the display panel.

A number of chip-on-films of the part of the plurality of chip-on-films connected to the pair of first PCBs may be two, and a number of chip-on-films of the other part of the plurality of chip-on-films connected to the pair of second PCBs may be four.

The display panel may include a first area having a first curvature; a second area having a second curvature and extending outward from the first area; and a third area having no curvature and extending outward from the second area.

One chip-on-film may be in the first area, two chip-on-films may be in the second area, and three chip-on-films may be in the third area.

The two chip-on-films in the second area may be connected to a first PCB, among the pair of first PCBs, and a second PCB among the pair of second PCBs, respectively.

The first curvature may be higher than the second curvature.

The plurality of chip-on-films may be equidistantly arranged.

Six of the plurality of chip-on-films may be arranged on one side from the center of the display panel, two PCBs among the plurality of PCBs may be arranged in parallel on the one side from the center of the display panel, and one PCB of the two PCBs may be connected to two chip-on-films and another one of the two PCBs may be connected to four chip-on-films.

According to an aspect of the disclosure, a display apparatus includes: a plurality of chip-on-films; a first printed circuit board (PCB) connected to a first part of the plurality of chip-on-films; and a second PCB provided farther outside of a display panel than the first PCB from a center of the display panel, the second PCB being connected to a second part of the plurality of chip-on-films, and a number of chip-on-films of the second part of the plurality of chip-on-films is different than a number of chip-on-films of the first part of the plurality of chip-on-films.

The number of chip-on-films of the first part of the plurality of chip-on-films connected to the first PCB may be two, and the number of chip-on-films of the second part of the plurality of chip-on-films connected to the second PCB may be four.

The display panel may include a first area having a first curvature; a second area having a second curvature and extending outward from the first area; and a third area having no curvature and extending outward from the second area.

The plurality of chip-on-films may be equidistantly arranged.

The display apparatus may include another plurality of chip-on-films connected to the display panel on other side of the center of the display panel arranged symmetrically to the plurality of chip-on-films.

Advantageous Effects

According to one or more embodiments, concentrated stress applied on chip-on-films and printed circuit boards (PCBs) in a curved display apparatus may be reduced by forming the plurality of PCBs to be divided at a particular point having a high degree of curvature deformation.

BRIEF DESCRIPTION OF THE DRAWINGS

The above and other aspects, features, and advantages of embodiments of the disclosure will be more apparent from the following description taken in conjunction with the accompanying drawings, in which.

DETAILED DESCRIPTION

Embodiments and features as described and illustrated herein are merely examples, and there may be various modifications to the embodiments and drawings.

Throughout the drawings, like reference numerals refer to like parts or components.

The terminology used herein is for the purpose of describing particular embodiments only and is not intended to limit the disclosure. It is to be understood that the singular forms "a," "an," and "the" include plural references unless the context clearly dictates otherwise. It will be further understood that the terms "comprise" and/or "comprising," when used in this specification, specify the presence of stated features, integers, steps, operations, elements, and/or components, but do not preclude the presence or addition of one or more other features, integers, steps, operations, elements, components, and/or groups thereof.

The terms including ordinal numbers like "first" and "second" may be used to explain various components, but the components are not limited by the terms. The terms are only for the purpose of distinguishing a component from another. Thus, a first element, component, region, layer or room discussed below could be termed a second element, component, region, layer or section without departing from the teachings of the disclosure. Descriptions shall be understood as to include any and all combinations of one or more of the associated listed items when the items are described by using the conjunctive term "~ and/or ~," or the like.

Reference will now be made in detail to embodiments, examples of which are illustrated in the accompanying drawings, wherein like reference numerals refer to the like elements throughout.

Figure 1:
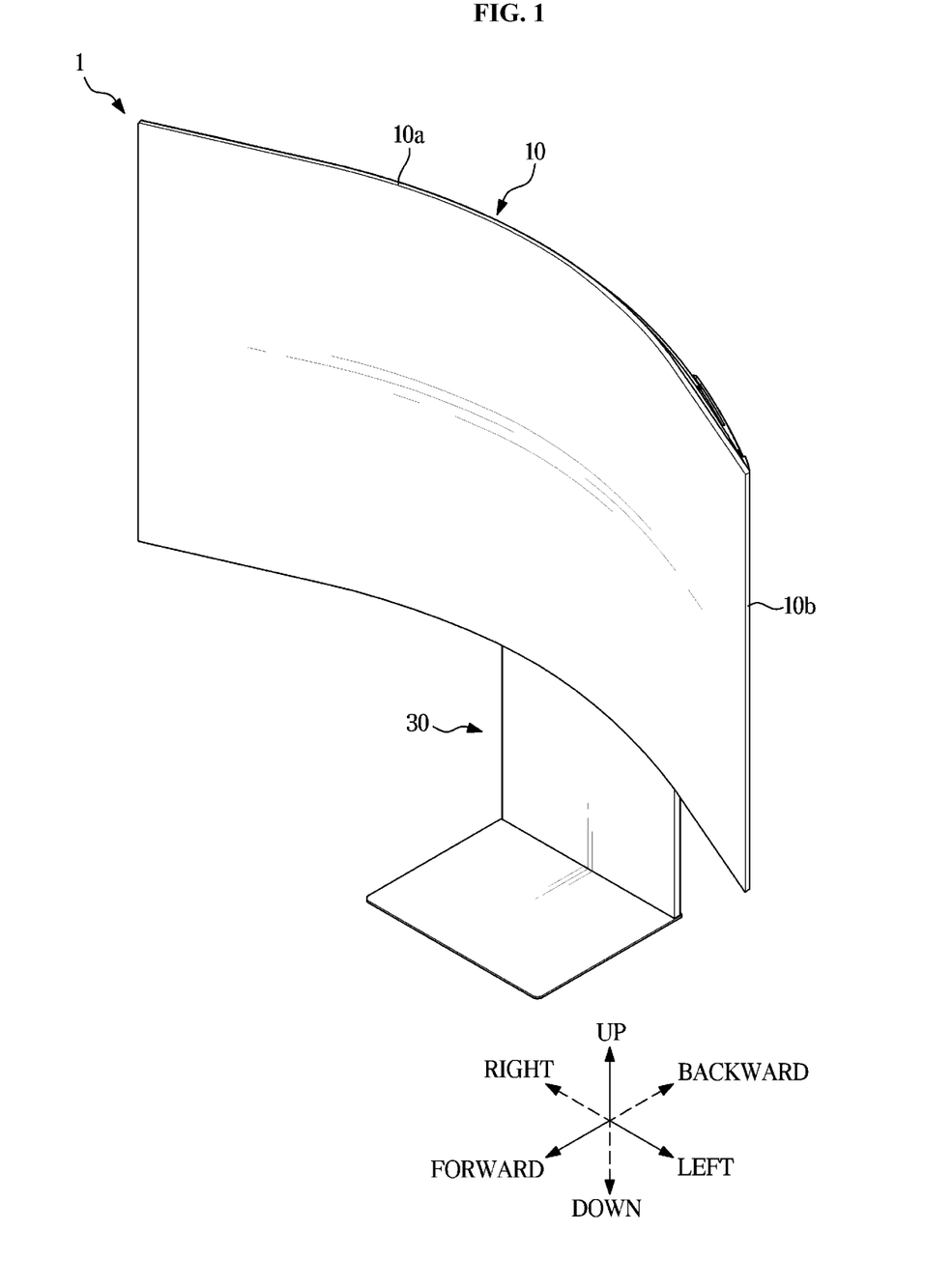
FIG. 1 is a perspective view of a display apparatus, according to an embodiment.
Figure 2:
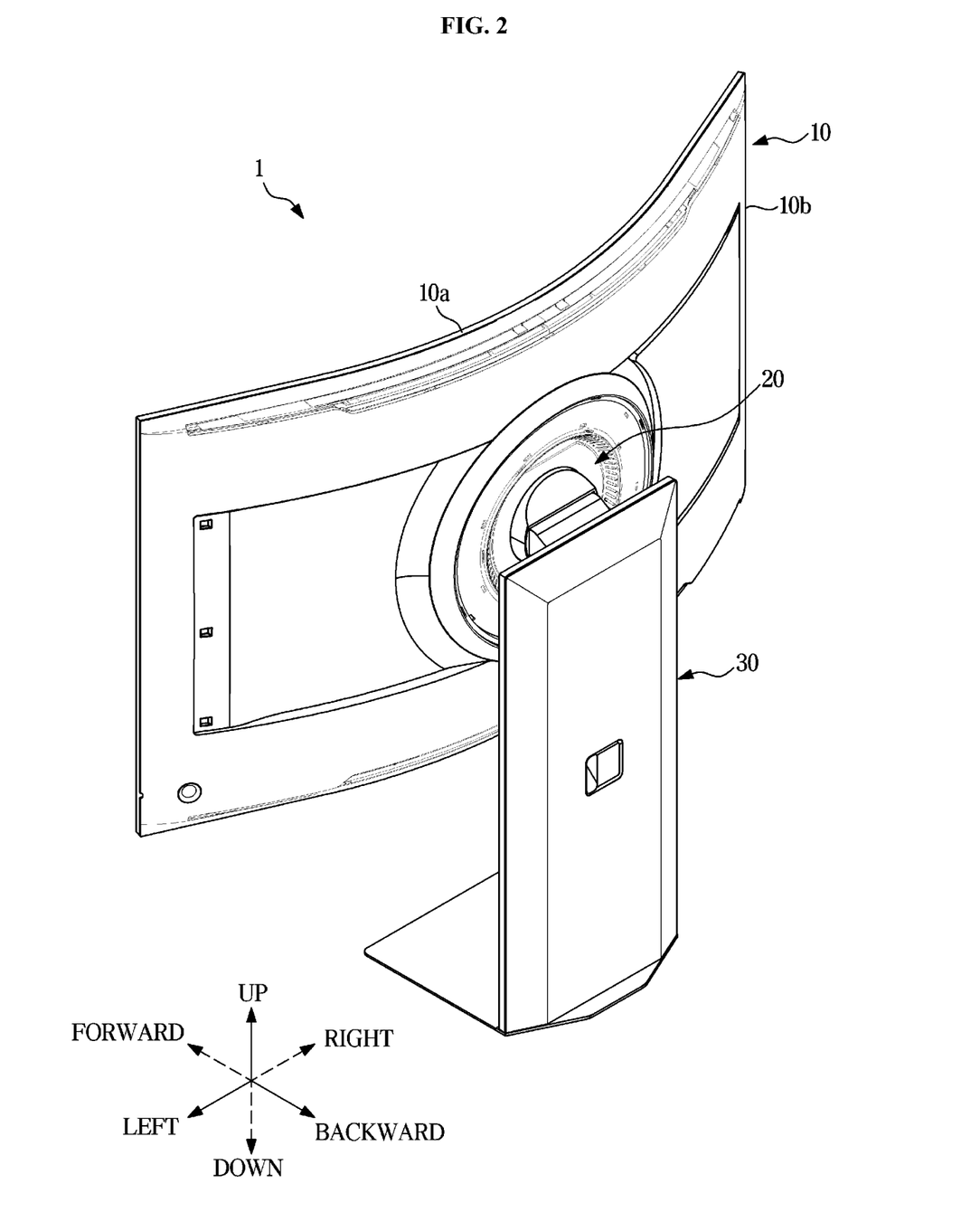
FIG. 2 is a rear perspective view of the display apparatus shown in FIG. 1.

FIG. 1 is a perspective view of a display apparatus, according to an embodiment. FIG. 2 is a rear perspective view of the display apparatus shown in FIG. 1.

The display module 10 may be a device for displaying information, materials, data, etc., in characters, figures, graphs, images, etc., and may include a television, a monitor, etc.

The display module 10 may be configured to display a screen. The display module 10 may include an actively light-emitting display panel such as Organic Light Emitting Diodes (OLEDs) or a passively light-emitting display panel such as Liquid Crystal Displays (LCDs). There are no particular limitations on the type of display panel.

The display module 10 may be provided to have different vertical and horizontal lengths. In other words, the display module may be provided to have long sides 10a and short sides 10b.

The display module 10 may be shaped like a rectangular plate. Furthermore, as shown in FIGS. 1 and 2, the display module 10 may be provided as a curved display with the long sides 10a formed to be rounded.

In an embodiment, a display apparatus 1 may include the display module 10, and a supporting bracket 20 and a supporting stand 30 provided to support the display module 10.

Referring to FIG. 2, the supporting bracket 20 may be coupled to the back of the display module 10. The supporting bracket 20 may support the display module 10 to allow pivot rotation of the display module 10.

Referring to FIGS. 1 and 2, the display module 10 may be positioned in one of a first mode in which the long sides 10a are placed horizontally and a second mode in which the long sides 10a are placed vertically. The display module 10 may make pivot rotation from the first mode to the second mode and may make pivot rotation from the second mode to the first mode.

In the display module 10 of the disclosure, the long side 10a may be about 1220.2 mm long and the short side 10b may be about 691.64 mm long. The size of the display module 10 is not, however, limited thereto, and the display module 10 may be provided in various sizes while maintaining the ratio between the long side 10a and the short side 10b.

A rear surface of the display apparatus 1 may be curved. For example, a rear curvature of a bottom chassis 15 may be identical to or different from a curvature of the display panel 12 of the display apparatus 1.

The rear curvature of the display apparatus 1 may be different from the curvature of the display panel 12. For example, the curvature of the display panel 12 may be higher than or equal to the rear curvature of the display apparatus 1.

Alternatively, the curvature of the display panel 12 may be lower than the rear curvature of the display apparatus 1.

Figure 3:
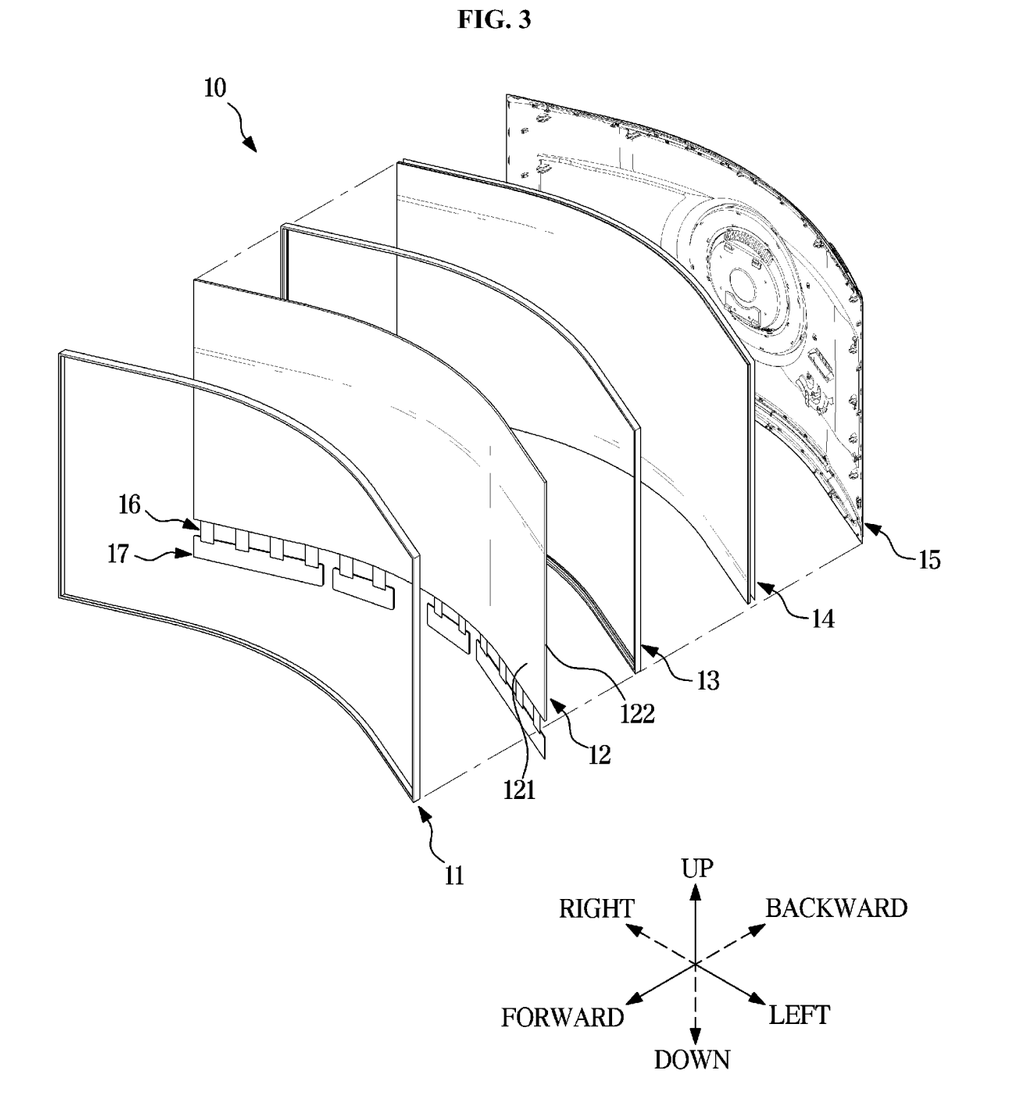
FIG. 3 is a schematic exploded view of a display module of a display apparatus, according to an embodiment.
Figure 4:
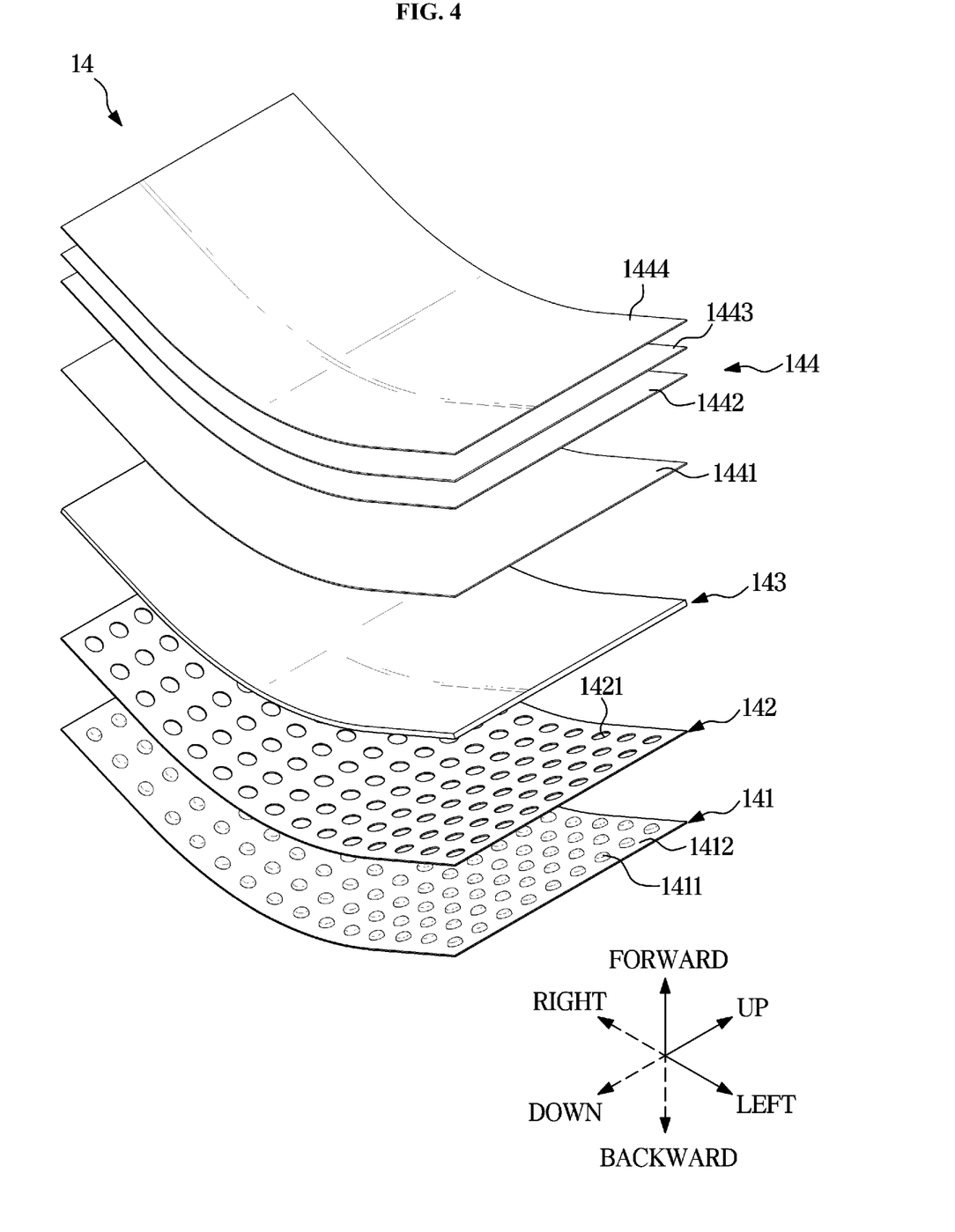
FIG. 4 is an exploded view of a light source device in the display module shown in FIG. 3.

FIG. 3 is a schematic exploded view of a display module of a display apparatus, according to an embodiment. FIG. 4 is an exploded view of a light source device in the display module shown in FIG. 3.

Referring to FIG. 3, the display apparatus 1 may include the bottom chassis 15, a light source device 14, a middle chassis 13, the display panel 12 and a top chassis 11.

Furthermore, at least one of the bottom chassis 15, the light source device 14, the middle chassis 13, the display panel 12 and the top chassis 11 in the display apparatus 1 may have a curvature corresponding to the curvature of the display apparatus 1.

The display panel 12 may display still images or moving images. The display panel 12 may display two-dimensional (2D) plane images, or three dimensional (3D) stereographic images using parallax of both eyes of the user.

A plurality of pixels may be formed on the display panel 12, and an image displayed on the display panel 12 may be formed by the light emitted by each of the plurality of pixels. For example, the light emitted by the plurality of pixels may be combined like mosaics into an image on the display panel 12.

The plurality of pixels may emit light in various colors and brightnesses.

For example, the plurality of pixels may each include a self-luminous panel that may directly emit light or a non-luminous panel that passes or blocks the light emitted by e.g., the light source device.

Each of the pixels P may include subpixels to emit different colors of light.

The subpixels may include a red subpixel to emit red light, a green subpixel to emit green light, and blue subpixel to emit blue light. For example, the red light may have wavelengths of about 620 nanometers (nm, a billionth of a meter) to about 750 nm; green light may have wavelengths of about 495 nm to about 570 nm; blue light may have wavelengths of about 450 nm to about 495 nm.

By combinations of the red light of the red subpixel, the green light of the green subpixel, and the blue light of the blue subpixel, the plurality of pixels may emit various brightnesses and colors of light.

The light source device 14 may include a point light source 1411 for emitting monochromatic light or white light, and refract, reflect, and scatter the light emitted from the point light source 1411 to convert the light to uniform surface light. For example, the light source device 14 may include the plurality of light sources 1411 for emitting monochromatic light or white light, a diffuser plate 143 for diffusing incident light from the plurality of light sources 1411, a reflective sheet 142 for reflecting light emitted from the plurality of light sources 1411 and the rear surface of the diffuser plate 143, and an optical sheet 144 for refracting and scattering light emitted from the front surface of the diffuser plate 143.

The light source device 14 may emit the uniform surface light in a forward direction by refracting, reflecting and scattering the light emitted from the light source 1411.

The bottom chassis 15 may be arranged to receive the display panel 12 and the light source device 14. The bottom chassis 15 may be formed in the shape of a high strength polygonal plate, and may include a metal substance (e.g., aluminum or aluminum alloy) having little thermal deformation caused by heat radiation of the received light source device 14 and/or the display panel 12.

The substance of the bottom chassis 15 is not, however, limited thereto, and may be formed of a plastic substance (poly carbonate (PC)). Furthermore, the bottom chassis 15 may be formed by adding glass fiber to the plastic substance.

The bottom chassis 15, the middle chassis 13 and the top chassis 11 may be coupled to each other to receive the display panel 12 and the light source device 14 inside and secure the positions.

The top chassis 11 may be coupled to the middle chassis 13 and the bottom chassis 15 that receive the display panel 12 and the light source device 14. The top chassis 11 may be arranged on the front of the display apparatus 1 and may prevent shocks applied from outside to the components received inside and/or leaks of the light (e.g., losses of light) emitted by the light source device 14 located inside.

The top chassis 11 may be formed along edges of the display panel 12. The top chassis 11 may have a cross-sectional form to cover top and side edges of the display panel 12. The top chassis 11 may be provided to have an open center, and the front side of the four edges of the top chassis 11 other than the open portion may be called a bezel.

The image output from the display panel 12 may be provided through the open portion of the top chassis 11 to the user in front.

The display panel 12 may include a first glass substrate 121, a liquid crystal display, and a second glass substrate 122.

The first and second glass substrates 121 and 122 may support the liquid crystal display to be fixed. The first and second glass substrates 121 and 122 may be formed of tempered glass or transparent resin.

Pixel electrodes may be provided on the inner side of the first glass substrate 121, and a common electrode may be provided on the inner side of the second glass substrate 122. The pixel electrode and the common electrode may be formed of a conductive metal substance and may produce an electric field to change arrangement of liquid crystal molecules of the liquid crystal display.

Referring to FIG. 4, the light source device 14 may include a light source module 141 for generating light, a reflective sheet 142 for reflecting light, a diffuser plate 143 for uniformly diffusing light, and an optical sheet 144 for enhancing brightness of output rays from the light sources 1411.

The light source module 141 may include a plurality of light sources 1411 for emitting light, and a substrate 1412 for supporting and fixing the plurality of light sources 1411.

The plurality of light sources 1411 may be arranged in a predefined pattern to emit light with uniform brightness. The plurality of light sources 1411 may be arranged such that one light source 1411 is equidistant from its neighboring light sources 1411.

For example, as shown in FIG. 4, the plurality of light sources 1411 may be arranged in rows and columns. Accordingly, the plurality of light sources 1411 may be arranged such that neighboring four light sources 1411 form almost a square. Furthermore, one light source 1411 is located to be adjacent to four other light sources 1411, and the distances between the light source 1411 and the four neighboring light sources 1411 may be almost the same.

In another example, the plurality of light sources 1411 may be arranged in multiple rows, and one light source 1411 belonging to a row may be placed in the middle of two light sources 1411 belonging to neighboring rows. Accordingly, the plurality of light sources 1411 may be arranged such that neighboring three light sources 1411 form almost a equilateral triangle. One light source 1411 is located to be adjacent to six other light sources 1411, and the distances between the light source 1411 and the six neighboring light sources 1411 may be almost the same.

The arrangement of the plurality of light sources 1411 is not, however, limited to the aforementioned patterns, and the plurality of light sources 1411 may be arranged in various patterns to emit light with uniform brightness.

The light sources 1411 may employ devices capable of emitting monochromatic light (light having a particular wavelength, e.g., blue light) or white light (mixed light of red light, green light, and blue light) to various directions when powered. For example, the light sources 1411 may include light emitting diodes (LEDs).

The substrate 1412 may fix the plurality of light sources 1411, and may be formed of a synthetic resin, tapered glass or a circuit board with conductive power supply lines formed therein to supply power to the light sources 1411.

The reflective sheet 142 may reflect the light emitted from the plurality of light sources 1411 to a forward direction or to a nearly forward direction.

A plurality of through holes 1421 may be formed on the reflection sheet 142 at positions respectively matching the plurality of light sources 1411 of the light source module 141. Furthermore, the light sources 1411 of the light source module 141 may pass through the through holes 1421 and protrude forward from the reflective sheet 142.

For example, the plurality of light sources 1411 of the light source module 141 may be inserted to the plurality of through holes 1421 formed at the reflective sheet 142 during an assembly process of the reflective sheet 142 and the light source module 141.

The plurality of light sources 1411 may emit light in various directions from the front of the reflective sheet 142. The light may be emitted not only toward the diffuser plate 143 but also toward the reflective sheet 142 from the light sources 1411, and the reflective sheet 142 may reflect the light emitted to the reflective sheet 142 toward the diffuser plate 143.

The light emitted from the light sources 1411 may pass various objects such as the diffuser plate 143 and the optical sheet 144. When the light is passing the diffuser plate 143 and the optical sheet 144, a portion of the incident light may be reflected from surfaces of the diffuser plate 143 and the optical sheet 144. The reflective sheet 142 may reflect the light reflected by the diffuser plate 143 and the optical sheet 144.

The diffuser plate 143 may be arranged in front of the light source module 141 and the reflective sheet 142 to uniformly diffuse the light emitted from the light sources 1411 of the light source module 141.

The plurality of light sources 1411 may be located everywhere on the rear surface of the light source device 14. The plurality of light sources 1411 are equidistantly arranged on the rear surface of the light source device 14, but there may be differences in brightness depending on the positions of the plurality of light sources 1411.

To avoid the non-uniformity in brightness due to the plurality of light sources 1411, the diffuser plate 143 may diffuse the light emitted from the plurality of light sources 1411 within the diffuser plate 143. In other words, the diffuser plate 143 may uniformly emit non-uniform light forward from the plurality of light sources 1411.

An optical sheet 144 may include various sheets to improve brightness and uniformity of the brightness. For example, the optical sheet 144 may include a diffuser sheet 1441, a first prism sheet 1442, a second prism sheet 1443, a reflective polarizer sheet 1444, etc.

The diffuser sheet 1441 diffuses light for uniformity of brightness. Light emitted from the light sources 1411 may be diffused by the diffuser plate 143 and may be further diffused by the diffuser sheet 1441 included in the optical sheet 144.

The first and second prism sheets 1442 and 1443 may concentrate the light diffused by the diffuser sheet 1441, thereby increasing brightness. The first and second prism sheets 1442 and 1443 may have triangular prism patterns, which are arranged next to each other to form a plurality of bands.

The reflective polarizer sheet 1444 is a kind of polarizer film, which may transmit a portion of the incident light while reflecting the other portions to enhance brightness. For example, the reflective polarizer sheet 1444 may pass light polarized in the same direction as a predetermined polarization direction of the reflective polarizer sheet 1444 and reflect light polarized in other directions than the predetermined polarization direction. Furthermore, the light reflected by the reflective polarizer sheet 1444 may be recycled inside the light source device 14, and this light recycle may enhance brightness of the display apparatus 1.

The optical sheet 144 is not, however, limited to the sheets or films as illustrated in FIG. 4, and may further include other various sheets or films such as protective sheets.

A plurality of chip-on-films 16 may be connected to the display panel 12. The plurality of chip-on-films 16 may be configured to process digital image data to output an analog image signal. The plurality of chip-on-films 16 may be electrically connected to a control assembly of the display panel 12.

The plurality of chip-on-films 16 may transmit image data and a driving current to the display panel 12.

A control assembly of the display panel 12 may include a control circuit for controlling operations of the liquid crystal display of the display panel 12 and the light source device 14. The control circuit may process image data received from an external content source, transmit image data to the liquid crystal display of the display panel 12, and transmit dimming data to the light source device 14. The control assembly may be implemented with a circuit board and various circuits mounted on the circuit board. For example, a power circuit may include a power circuit board, and a capacitor, a coil, a resistor and a processor, which are mounted on the power circuit board. Furthermore, the control circuit may include a control circuit board with a memory and a processor mounted thereon.

The display panel 12 and a plurality of printed circuit boards (PCBs) 17 may be electrically connected to each other through the plurality of chip-on-films 16. The plurality of chip-on-films 16 may electrically connect the display panel 12 supported inside the bottom chassis 15 to the plurality of PCBs 17 located outside the bottom chassis 15. The plurality of PCBs 17 and the plurality of chip-on-films 16 located outside the bottom chassis 15 may be covered by a rear cover not to be exposed to the outside.

In the disclosure, 4, 2, 2 and 4 of the plurality of chip-on-films 16 may each be connected to one of the plurality of PCBs 17 from left to right when viewed from the front of the display apparatus. This will be described later in detail.

Figure 5:
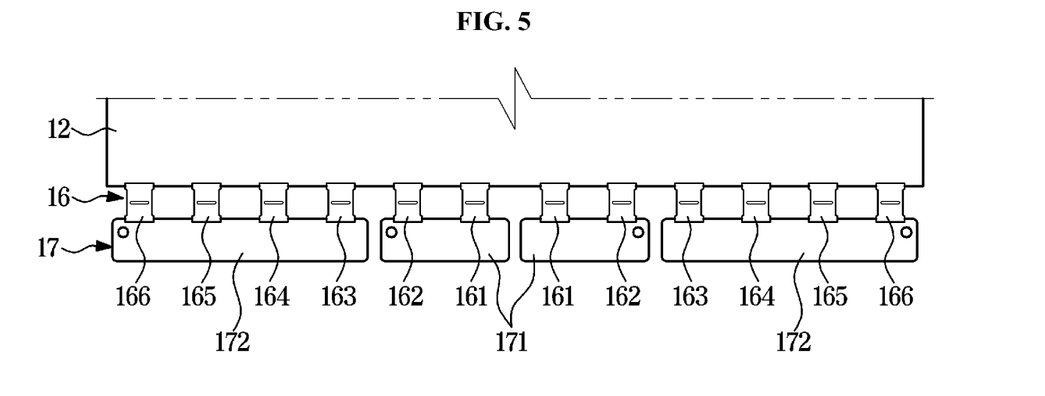
FIG. 5 is a schematic front view of a display panel, a plurality of chip-on-films and a plurality of circuit boards in a display apparatus, according to an embodiment.

FIG. 5 is a schematic front view of a display panel, a plurality of chip-on-films and a plurality of PCBs in a display apparatus, according to an embodiment.

As shown in FIG. 5, the display apparatus 1 may include a plurality of chip-on-films 16 connected to the display panel 12.

The plurality of chip-on-films 16 may be connected to one side of the display panel 12 based on the center of the display panel 12. The one side of the display panel 12 may refer to the left-hand side of the display panel 12 based on FIG. 5.

The plurality of PCBs 17 may include a first PCB 171 and a second PCB 172. The first PCB 171 may be connected to a first part of the plurality of chip-on-films 16.

The second PCB 172 may be arranged on farther outside of the display panel 12 than the first PCB 171 from the center of the display panel 12. The outside of the display panel 12 may refer to a side nearer to the left of the display panel 12 based on FIG. 5.

The second PCB 172 may be connected to a second part of the plurality of chip-on-films 16, the number of chip-on-films of the second part of the plurality of chip-on-films 16 being different from the number of chip-on-films of the first part of the plurality of chip-on-films 16.

For example, the number of chip-on-films of the first part of the plurality of chip-on-films 16 connected to the first PCB 171 may be two, and the number of chip-on-films of the second part of the plurality of chip-on-films 16 connected to the second PCB 172 may be four.

For example, the first part of the plurality of chip-on-films 16 may include a first chip-on-film 161 and a second chip-on-film spaced apart from the first chip-on-film 161.

The second part of the plurality of chip-on-films 16 may include a third chip-on-film 163 spaced apart from the second chip-on-film 162, a fourth chip-on-film 164 spaced apart from the third chip-on-film 163, a fifth chip-on-film 165 spaced apart from the fourth chip-on-film 164, and a sixth chip-on-film 166 spaced apart from the fifth chip-on-film 165.

The first PCB 171 and the second PCB 172 may be separated from each other between the second chip-on-film 162 and the third chip-on-film 163. In other words, the first PCB 171 may be connected to the first chip-on-film 161 and the second chip-on-film 162, and the second PCB 172 may be connected to the third chip-on-film 163, the fourth chip-on-film 164, the fifth chip-on-film 165 and the sixth chip-on-film 166.

The plurality of chip-on-films 16 may be equidistantly arranged.

Furthermore, on the other side from the center of the display panel 12, which is symmetrical to the one side, the plurality of chip-on-films 16 and the plurality of PCBs 17 may be arranged in the same layout as described above.

For example, the display apparatus 1 may further include another plurality of chip-on-films 16 connected to the display panel 12 on the other side symmetrical to the one side from the center of the display panel 12 and arranged symmetrically with the plurality of chip-on-films 16 arranged on the one side of the display panel 12.

For example, the plurality of PCBs 17 of the display apparatus 1 may be connected to the plurality of chip-on-films 16 and separately arranged to have bilateral symmetry based on the center of the display panel 12. Of the plurality of PCBs 17, PCBs 171 and 172 located asymmetrically based on the center of the display panel 12 may be connected to different numbers of chip-on-films 16.

The plurality of PCBs 17 may include a pair of first PCBs 171 connected to part of the plurality of chip-on-films 16 and symmetrically arranged from the center of the display panel 12. Furthermore, the plurality of PCBs 17 may include a pair of second PCBs 172 connected to the other part of the plurality of chip-on-films 16 and symmetrically arranged from the center of the display panel 12.

The number of chip-on-films of the part of the plurality of chip-on-films 16 connected to each of the pair of first PCBs 171 may be two, and the number of chip-on-films of the other part of the plurality of chip-on-films 16 connected to each of the pair of second PCBs 172 may be four.

Furthermore, a total of 6 chip-on-films may be arranged on one side from the center of the display panel 12 among the plurality of chip-on-films 16. Two of the plurality of PCBs 17 may be arranged side by side on one side from the center of the display panel 12. The two PCBs 171 and 172 may be connected to two chip-on-films and four chip-on-films, respectively.

For example, the first PCB 171 may be connected to the first chip-on-film 161 and the second chip-on-film 162, and the second PCB 172 may be connected to the third chip-on-film 163, the fourth chip-on-film 164, the fifth chip-on-film 165 and the sixth chip-on-film 166.

Figure 6:
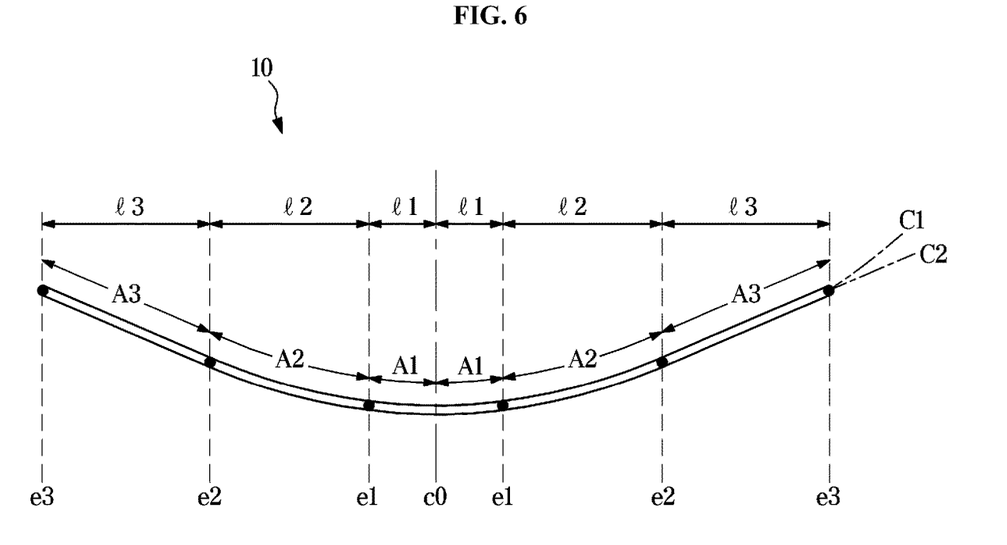
FIG. 6 is a schematic plan view of a display apparatus, according to an embodiment.
Figure 7:
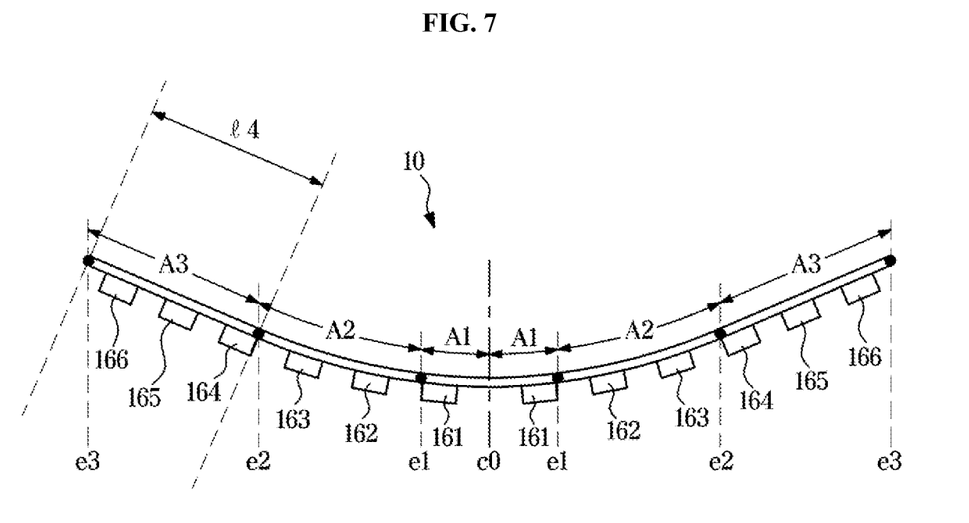
FIG. 7 is a schematic plan view illustrating positions of a plurality of chip-on-films arranged in the display apparatus, according to an embodiment.

FIG. 6 is a schematic plan view of a display apparatus, according to an embodiment. FIG. 7 is a schematic plan view illustrating positions of a plurality of chip-on-films arranged in the display apparatus shown in FIG. 6.

Referring to FIGS. 6 and 7, the display apparatus 1 may be provided to have a first curvature C1 and a second curvature C2.

The display panel 12 of the display apparatus 1 may have the first curvature C1 and the second curvature C2. The bottom chassis 15, the middle chassis 13 and the top chassis 11 may have the first curvature C1 and the second curvature C2. The light source device 14 of the display apparatus 1 may also have the first curvature C1 and the second curvature C2.

The curvatures of the display apparatus 1 may be defined by one of the bottom chassis 15, the middle chassis 13 and the top chassis 11. Furthermore, the curvatures of the display apparatus 1 may be defined by a combination of the bottom chassis 15, the middle chassis 13 and the top chassis 11.

In an embodiment of the disclosure, the bottom chassis 15, the middle chassis 13 and the top chassis 11 may be called stationary members. For example, the curvatures of the display apparatus 1 may be defined by the stationary members.

The display apparatus 1 may have a variable curvature.

For example, the display module 10 of the display apparatus 1 may include a first area A1, a second area A2, and a third area A3.

The first area A1 may be provided to include a center point c0 of the display module 10 and a first point e1 first length l1 away from the center point c0.

The second area A2 may be provided to include the first point e1 and a second point e2 second length l2 away from the first point e2.

The third area A1 may be provided to include the second point e2 and a third point e3 third length l3 away from the second point e2.

The first area A1 may have the first curvature c1. The second area A2 may have the second curvature C2.

The first curvature C1 may be set to be higher than the second curvature C2, e.g., further curved.

For example, the first curvature C1 may be set to about 766.36R, and the second curvature C2 may be set to about 855.22R. The display module 10 has a variable curvature without being limited to the above examples.

The display module 10 of the display apparatus 1 may include the first area A1 having the first curvature c1, the second area A2 extending outward from the first area A1 and having a curvature lower than the first curvature c1, and the third area A3 extending outward from the second area A2. The third area A3 may be a linear area having no curvature.

An average curvature of the first, second and third areas A1, A2 and A3 may be about 1000R. For example, the average curvature of the display module 10 may be set to be in a range of 10% of 1000R, i.e., 990R to 1100R.

The first length l1 may be set to about 69.94 mm. A sum of the first length l1 and the second length l2 may be set to about 331.8 mm.

Referring to FIGS. 5 and 7, the layout of the plurality of chip-on-films 16 corresponding to the curved sections of the display panel 12 will be described.

As shown in FIG. 7, the first chip-on-film 161 may be arranged in the first area A1. The second and third chip-on-films 162 and 163 may be arranged in the second area A2. The fourth, fifth and sixth chip-on-films 164, 165 and 166 may be arranged in the third area A3.

As shown in FIG. 5, the first chip-on-film 161 and the second chip-on-film 162 may be connected to the first PCB 171, and the third chip-on-film 163, the fourth chip-on-film 164, the fifth chip-on-film 165 and the sixth chip-on-film 166 may be connected to the second PCB 172.

Fourth length l4 of the third area A3 may be set to about 268.66 mm.

In the disclosure, as the first curvature C1 of the first area A1 is higher than the second curvature C2 of the second area A2, a change in curvature is big between the second chip-on-film 162 and the third chip-on-film 163.

As the first PCB 171 and the second PCB 172 are separated between the second chip-on-film 162 and the third chip-on-film 163, concentrated stress applied to the plurality of chip-on-films 16 and the plurality of PCBs 17 may be reduced.

The disclosure has a technical effect of preventing damage to the chip-on-films 16 and the PCBs 17 with a minimal design change by changing only a split line of the plurality of PCBs 17 connected to the plurality of chip-on-films 16 to reduce the stress.

One or more embodiments of the disclosure have been described above, but a person of ordinary skill in the art will understand and appreciate that various modifications can be made without departing from the scope of the disclosure. Thus, it will be apparent to those or ordinary skill in the art that the true scope of technical protection is only defined by the following claims.

What is claimed is:

1. A display apparatus comprising:
   a display panel;
   a plurality of chip-on-films connected to a side of the display panel;
   a first printed circuit board (PCB) connected to a first part of the plurality of chip-on-films; and
   a second PCB provided farther outside of the display panel than the first PCB from a center of the display panel, the second PCB being connected to a second part of the plurality of chip-on-films, and a number of chip-on-films of the second part of the plurality of chip-on-films is different than a number of chip-on-films of the first part of the plurality of chip-on-films,
   wherein a length of the first PCB is shorter than a length of the second PCB,
   wherein the display panel comprises:
   a first area having a first curvature;
   a second area having a second curvature and extending outward from the first area; and a third area having no curvature and extending outward from the second area.

2. The display apparatus of claim 1, wherein the number of chip-on-films of the first part of the plurality of chip-on-films connected to the first PCB is two, and
   wherein the number of chip-on-films of the second part of the plurality of chip-on-films connected to the second PCB is four.

3. The display apparatus of claim 1, wherein the first part of the plurality of chip-on-films comprises: a first chip-on-film; and a second chip-on-film spaced apart from the first chip-on-film, wherein the second part of the plurality of chip-on-films comprises: a third chip-on-film spaced apart from the second chip-on-film; a fourth chip-on-film spaced apart from the third chip-on-film; a fifth chip-on-film spaced apart from the fourth chip-on-film, and a sixth chip-on-film spaced apart from the fifth chip-on-film.

4. The display apparatus of claim 1, wherein the first curvature is higher than the second curvature.

5. The display apparatus of claim 1, wherein the plurality of chip-on-films are equidistantly arranged.

6. The display apparatus of claim 1, further comprising another plurality of chip-on-films connected to the display panel on another side of the center of the display panel and arranged symmetrically to the plurality of chip-on-films.

7. The display apparatus of claim 1, further comprising:
   a light source module behind the display panel and configured to generate light; and
   an optical sheet between the light source module and the display panel.

8. The display apparatus of claim 1, further comprising:
   a bottom chassis provided behind the display panel and having a curvature; and
   a top chassis provided in front of the display panel and having a curvature.

9. The display apparatus of claim 3, wherein the first chip-on-film is in the first area, the second chip-on-film and the third chip-on-film are in the second area, and the fourth chip-on-film, the fifth chip-on-film, and the sixth chip-on-film are in the third area.

10. The display apparatus of claim 9, wherein the first PCB is separate from the second PCB between the second chip-on-film and the third chip-on-film.

11. A display apparatus comprising:
    a display panel having a curvature;
    a plurality of chip-on-films connected to the display panel; and
    a plurality of printed circuit boards (PCBs) connected to the plurality of chip-on-films and separately arranged to have bilateral symmetry based on a center of the display panel, wherein a number of chip-on-films connected to a pair of first PCBs is different than a number of chip-on films connected to a pair of second PCBs,
    wherein a length of the pair of first PCBs is shorter than a length of the pair of second PCBs,
    wherein the pair of first PCBs is connected to a part of the plurality of chip-on-films and symmetrically arranged based on the center of the display panel; and wherein the pair of second PCBs is connected to another part of the plurality of chip-on-films and symmetrically arranged based on the center of the display panel.

12. The display apparatus of claim 11, wherein a number of chip-on-films of the part of the plurality of chip-on-films connected to the pair of first PCBs is two, and
wherein a number of chip-on-films of the other part of the plurality of chip-on-films connected to the pair of second PCBs is four.

13. The display apparatus of claim 11, wherein the display panel comprises:
a first area having a first curvature;
a second area having a second curvature and extending outward from the first area; and
a third area having no curvature and extending outward from the second area.

14. The display apparatus of claim 11, wherein the plurality of chip-on-films are equidistantly arranged.

15. The display apparatus of claim 11, wherein six of the plurality of chip-on-films are arranged on one side from the center of the display panel,
wherein two PCBs among the plurality of PCBs are arranged in parallel on the one side from the center of the display panel,
wherein one PCB of the two PCBs is connected to two chip-on-films, and
wherein another one of the two PCBs is connected to four chip-on-films.

16. The display apparatus of claim 13, wherein one chip-on-film is in the first area, two chip-on-films are in the second area, and
wherein three chip-on-films are in the third area.

17. The display apparatus of claim 13, wherein the first curvature is higher than the second curvature.

18. The display apparatus of claim 16, wherein the two chip-on-films in the second area are connected to a first PCB, among the pair of first PCBs, and a second PCB, among the pair of second PCBs, respectively.

* * * * *